United States Patent [19]

Yonekawa

[11] Patent Number: 5,654,792
[45] Date of Patent: Aug. 5, 1997

[54] PROJECTION EXPOSURE APPARATUS WHICH DETERMINES THE MINIMUM NUMBER OF SHOTS TO OPTIMIALLY EXPOSE THE SUBSTRATE SURFACE

[75] Inventor: Masami Yonekawa, Utsunomiya, Japan

[73] Assignee: Canon Kabushiki Kaisha, Tokyo, Japan

[21] Appl. No.: 592,667

[22] Filed: Jan. 26, 1996

[30] Foreign Application Priority Data

Jan. 27, 1995 [JP] Japan ................. 7-011713

[51] Int. Cl.⁶ ................. G03F 7/20; H01L 21/027
[52] U.S. Cl. ................. 355/53; 355/77; 250/492.2; 250/548; 364/468.01
[58] Field of Search ................. 356/399, 400, 356/401; 250/548; 355/53, 54

[56] References Cited

U.S. PATENT DOCUMENTS 4,489,241 12/1984 Matsuda et al. ................. 250/491.1
5,194,741 3/1993 Sakamoto et al. ................. 250/492.2
5,305,222 4/1994 Nakamura ................. 355/53
5,337,247 8/1994 Hamaguchi ................. 355/53

*Primary Examiner*—Arthur T. Grimley
*Assistant Examiner*—Shival P. Virmani
*Attorney, Agent, or Firm*—Fitzpatrick, Cella, Harper & Scinto

[57] ABSTRACT

Disclosed is a projection exposure apparatus for projecting a pattern of an original onto different regions on a substrate sequentially, wherein, on the basis of information related to a chip layout upon the substrate and of at least a chip layout within a projection exposure field and a chip layout within the pattern of the original, a first shot layout with which the number of shots is minimum when the shot layout takes a grid-like form, is determined. Also, on the basis of the information, a second shot layout with which shots are placed in sequence, from an end of the chip layout upon the substrate, without overlap of shots, is determined. The first and second shot layouts are then compared with each other, and one of them which provides a smaller number of shots is selected as a shot layout for the projection exposure operation.

7 Claims, 15 Drawing Sheets

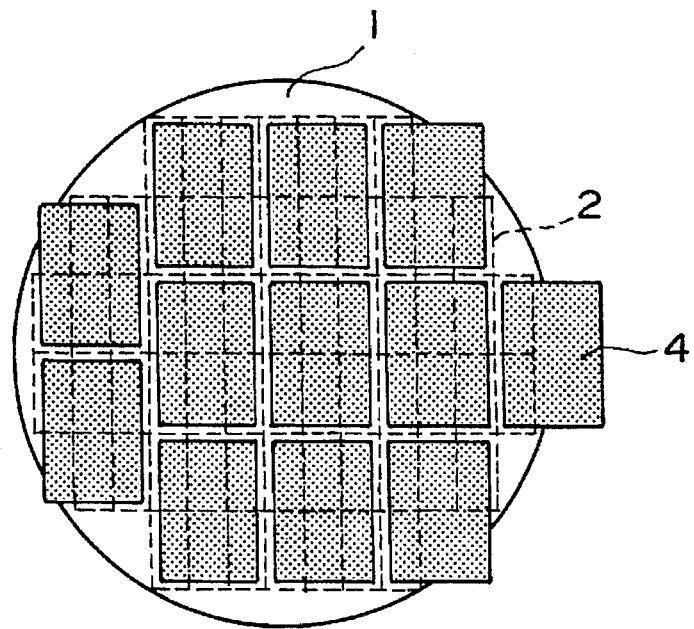
F I G. 1
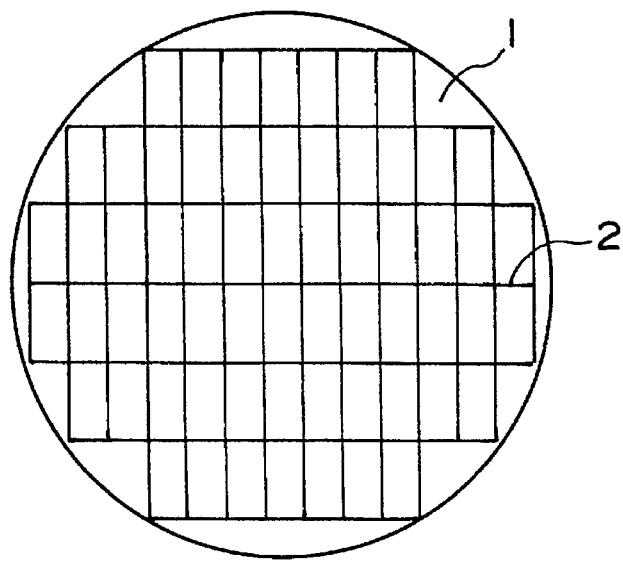
F I G. 2

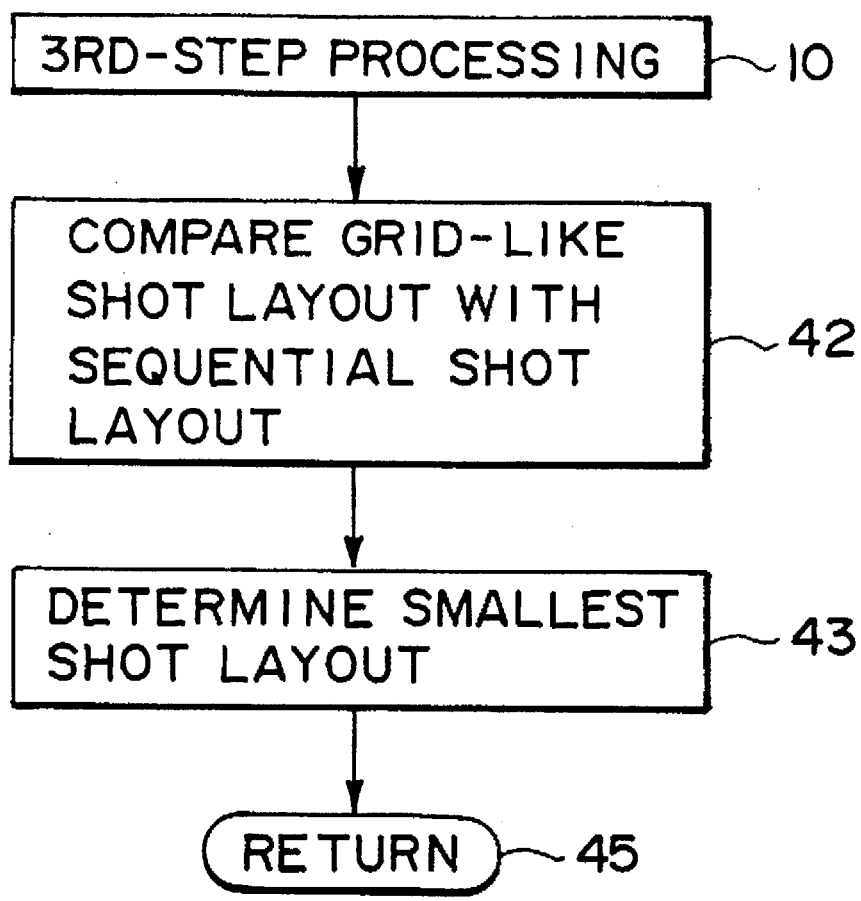
F I G. 20

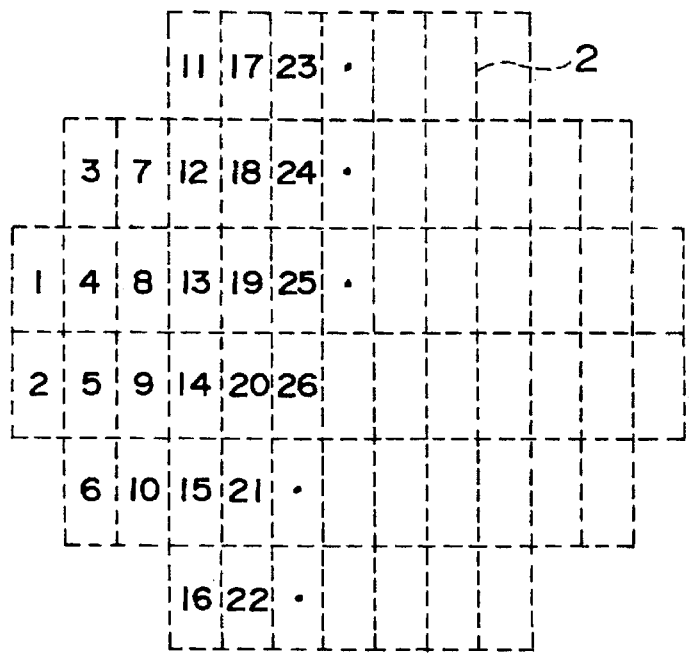
F I G. 21
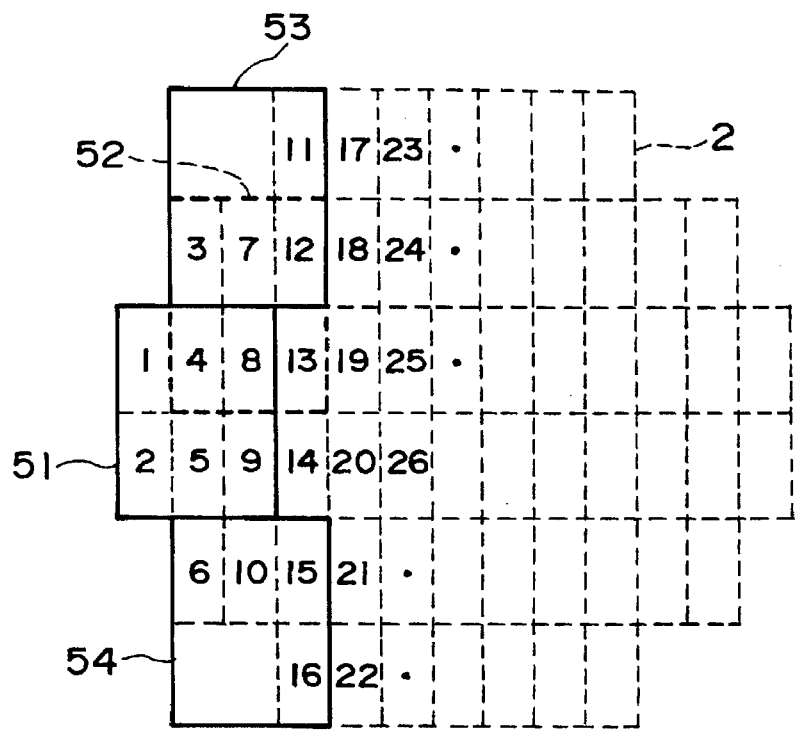
F I G. 22

PROJECTION EXPOSURE APPARATUS WHICH DETERMINES THE MINIMUM NUMBER OF SHOTS TO OPTIMALLY EXPOSE THE SUBSTRATE SURFACE

FIELD OF THE INVENTION AND RELATED ART

This invention relates to a projection exposure apparatus, called a stepper, to be used in manufacture of semiconductor devices, for example, such as ICs or LSIs, for projecting and printing an electronic circuit forming pattern of a reticle upon shots (zones) of a wafer sequentially.

Increasing degree of integration of a semiconductor device such as IC or LSI has required further improvement of the performance of a stepper. The performance of a stepper is represented by resolution, alignment precision and throughput. Particularly, as regards the throughput, it is considered most important from the standpoint of C.O.O. (Cost Of Ownership) which is a recently proposed concept aiming at quantifying the efficiency of investment of a semiconductor device manufacturing apparatus. For reduction of the C.O.O., in recent semiconductor device manufacturing processes, a mix-and-match method has been proposed in which a higher resolution stepper is used for a critical layer while a wider field stepper having a lower resolution is used for a non-critical layer to thereby increase the throughput.

When a stepper is used to project and print a circuit pattern of a reticle upon a wafer, usually the shot layout is determined so that a largest number of chips are provided from that wafer. As an example, when the chip size is 18 mm (longitudinal)×10 mm (lateral), at the maximum, chips of a number not less than a hundred and forty (140) can be provided from an 8-inch wafer. In conventional steppers, the shot layout for enabling this chip layout is grid-like one.

For example, a grid-like chip layout such as shown in FIG. 2 is now considered. In this drawing, denoted at 1 is a wafer (orientation flat not shown), and denoted at 2 is the chip layout. In this layout, if one shot (exposure) of a stepper performs exposure of two chips as the shot pattern 3 illustrated in FIG. 4, the resultant shot layout is such as shown in FIG. 3. For completing the exposure of the whole wafer surface, thirty-four (34) shots are necessary. This shot layout may be taken as one according to a higher resolution stepper, in the above-described mix-and-match method. In this chip layout, with a wider field stepper, one shot (exposure) of the stepper performs exposure of six chips, as the shot pattern 4 shown in FIG. 6. Therefore, in this case, the shot layout such as illustrated in FIG. 5 is defined, and the number of shot is thirteen (13).

SUMMARY OF THE INVENTION

In these examples, the shot layout defined on the wafer 1 is grid-like one. Thus, as seen from FIG. 5, one extra exposure step is necessary to perform exposure of the two shots which are at the right-hand end of the middle row of the wafer. This means that the layout does not always assure minimization of the number of exposure shots. Particularly, for a wider field stepper with which the throughput can be 90 wafers up per hour in the case of 8-inch wafers, even reduction of the number of exposure shots by only one can provide a significant effect.

If the throughput is 90 wafers per hour, for example, the process time per wafer is about 40 seconds. If the number of shots per wafer is twenty (20), the time period necessary for one shot (including stage stepping, alignment operation, focusing operation, exposure operation) is about 2 seconds. Thus, if the number of exposure shots decreases by one, simply it leads to reduction of time of 2 (sec.)×90=180 seconds per hour. This enables additional processing of four or more wafers.

As described, the increase/decrease of the throughput of the stepper due to the number of shots directly influences the manufacture. It is therefore very important in the mix-and-match method to minimize the number of total manufacturing process shots, including those for the critical layer and the non-critical layer.

It is accordingly an object of the present invention to provide a projection exposure apparatus and/or a semiconductor device manufacturing method which enables exposure of the whole surface of a wafer with a least number of shots, constantly, to thereby assure manufacture of semiconductor devices at a higher throughput.

In accordance with an aspect of the present invention, there is provided a projection exposure apparatus for projecting a pattern of an original onto different regions on a substrate sequentially, said apparatus comprising: shot layout determining means serviceable to determine, on the basis of information related to a chip layout upon the substrate and of at least a chip layout within a projection exposure field and a chip layout within the pattern of the original, a first shot layout with which the number of shots is minimum when the shot layout takes a grid-like form and a second shot layout with which shots are placed in sequence, from an end of the chip layout upon the substrate, without overlap of shots, said shot layout determining means further being serviceable to compare the first and second shot layouts with each other and to select one of them which defines a smaller number of shots; and projection exposure means for performing a projection exposure operation in accordance with the shot layout as selected by said shot layout determining means.

In one preferred form of this aspect of the present invention, said shot layout determining means may include means for determining the first shot layout by superposing, upon the chip layout on the substrate, a grid-like array of rectangular areas each corresponding to the projection exposure field, and by counting the number of effective shots while moving the array, to determine a layout of a least shot number.

In another preferred form of this aspect of the present invention, said shot layout determining means may include means for determining the second shot layout by assigning ordinal references (or ordinal numbers) to chips of the chip layout on the substrate and to chips of the chip layout within the range of the projection exposure field and by repeatedly placing shots while superposing a chip of an earliest reference (or a smallest ordinal number) in the chip layout of the substrate and a chip of an earliest reference (or a smallest ordinal number) in the chip layout within the projection exposure field, without overlap of shots.

In a further preferred form of this aspect of the present invention, said shot layout determining means may select the first shot layout when the second shot layout is not defined.

In accordance with another aspect of the present invention, there is provided a semiconductor device manufacturing method for performing a semiconductor device manufacturing process, including projecting a pattern of an original onto different regions on a substrate sequentially, said method comprising: a first step for determining, on the basis of information related to a chip layout upon the substrate and of at least a chip layout within a projection exposure field and a chip layout within the pattern of the original, a first shot layout with which the number of shots is minimum when the shot layout takes a grid-like form; a second step for determining, on the basis of the information, a second shot layout with which shots are placed in sequence, from an end of the chip layout upon the substrate, without overlap of shots; and a third step for comparing the first and second shot layouts with each other and selecting one of them which defines a smaller number of shots, as a shot layout for the projection exposure operation.

In one preferred form of this aspect of the present invention, the first shot layout may be determined by superposing, upon the chip layout on the substrate, a grid-like array of rectangular areas each corresponding to the projection exposure field, and by counting the number of effective shots while moving the array to determine a layout of a least shot number.

In another preferred form of this aspect of the present invention, the second shot layout may be determined by assigning ordinal references (or ordinal numbers) to chips of the chip layout on the substrate and to chips of the chip layout within the range of the projection exposure field and by repeatedly placing shots while superposing a chip of an earliest reference (or a smallest ordinal number) in the chip layout of the substrate and a chip of an earliest reference (or a smallest ordinal number) in the chip layout within the projection exposure field, without overlap of shots.

In accordance with a preferred embodiment of the present invention, in the case of the chip layout of FIG. 2, to the chip layout 2 which is predetermined upon the wafer 1, a layout (see FIG. 5) which is based on the shot layout wherein shots 4 such as shown in FIG. 6 are arrayed in a grid-like form and which assures a least number of shots 4 (shot number), is first determined. In this example, the shot number according to the grid-like shot layout as shown in FIG. 5 is thirteen (13). Then, to the chip layout 2 on the wafer 1, shots 4 are placed sequentially from an end of the chips so that there does not occur overlapping of shots. This placement will be referred to in this Specification as "sequential random shot placement". By this, a shot layout such as shown in FIG. 1 is determined. In this example, the shot number according to the sequential random shot placement as shown in FIG. 1 is twelve (12). After this, the shot layout of FIG. 5 and the shot layout of FIG. 1 are compared with each other, and one of them which assures a smaller shot number is selected for the projection exposure operation. In this example, from comparison of thirteen shots and twelve shots, the sequential random shot placement shown in FIG. 1 is selected.

Use of two shot layout algorithms in the shot layout determination, as described above, does not mean that the sequential random shot placement constantly assures a smaller shot number than by the grid-like shot placement. Rather, it is to meet the possibility that, depending on the wafer size, chip size or exposure field of a projection optical system, etc., the grid-like shot placement provides a smaller shot number or the sequential random shot placement provides a smaller shot number.

When the present invention in this aspect is applied to determination of the shot layout, the shot number may be reduced as compared with that by conventional steppers. Particularly, in a wider field stepper having a higher throughput, increase/decrease of only one shot during the processing of one wafer substantively influences the practical production. In the mix-and-match method, It is very important to minimize the shot number during the overall manufacturing processes, including for a critical layer and for a non-critical layer. There is an additional advantage that, with the present invention, modification of the hardware of the stepper is unnecessary. Enhancement of throughput is possible with modification of software, simply.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view for explaining an example of shot layout upon a wafer.

FIG. 2 is a schematic view for explaining an example of chip layout on a wafer.

FIG. 20 is a flow chart for explaining details of the process of the third step in this embodiment.

FIG. 21 is a schematic view for explaining another embodiment of the present invention.

FIG. 22 is a schematic view for explaining a further embodiment of the present invention.

DESCRIPTION OF THE PREFERRED EMBODIMENTS

Figure 25:
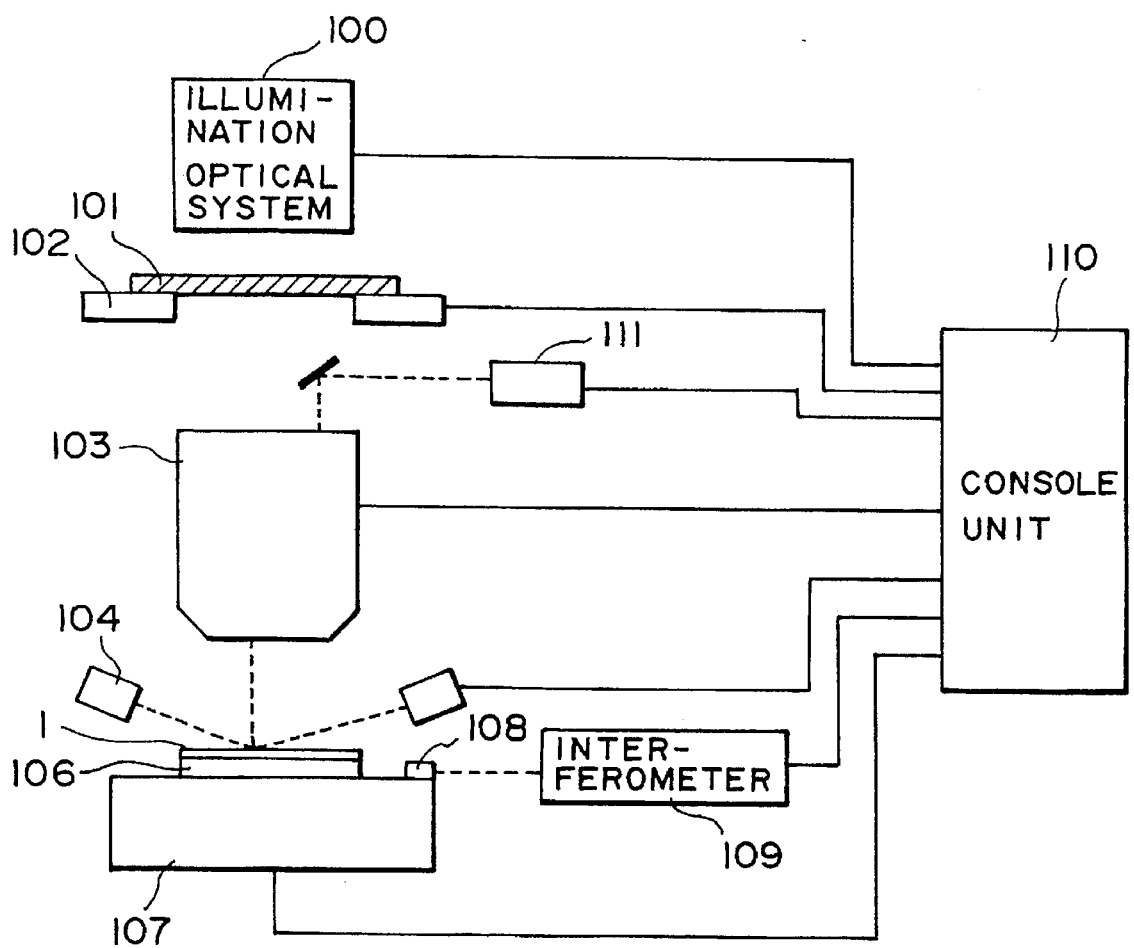
FIG. 25 is a schematic and diagrammatic view of a projection exposure apparatus for manufacture of semiconductor devices, to which apparatus the present invention is applicable.

The present invention will be described below in greater detail. Before describing the present invention, the basic structure of a projection exposure apparatus of step-and-repeat type (or scan type) to which the present invention is applicable, will be explained with reference to FIG. 25 of the drawings. In FIG. 25, denoted at 100 is an illumination optical system for providing exposure light with which a pattern (having plural chip patterns) formed on a reticle 101 is projected and printed upon a photosensitive resist layer, formed on a wafer 1. Denoted at 102 is a reticle stage for holding the reticle 101. In response to irradiation of the reticle 101 as held by this reticle stage 102 with the exposure light from the illumination optical system 100, the pattern of the reticle 101 is projected by a reduction projection lens system 103 onto the wafer 1 held by a wafer chuck 106, in a reduced scale.

Denoted at 104 is an autofocus detector of known type, which serves to project a light beam onto the surface of the wafer 1 and to photoelectrically detect reflection light therefrom. Based on this detection, the position of the wafer 1 surface with reference to the focusing plane of the projection lens 103 with respect to the optical axis direction (Z-axis direction) is detected. In accordance with the result of detection, the wafer chuck 106 is moved by a driving mechanism (not shown) in the direction of optical axis of the projection lens 103, such that the wafer 1 surface is placed at the focusing plane of the projection lens 103. Denoted at 107 is a wafer stage for moving the wafer 1, held by the wafer chuck 106, along a plane (X-Y plane) which is perpendicular to the optical axis of the projection lens 103. This wafer stage performs step-and-repeat motion for sequential exposures of different regions (zones) of the wafer 1 surface.

Denoted at 108 is a mirror which is movable along the X-Y plane, together with the wafer stage 107. Denoted at 109 is a laser interferometer type distance measuring unit of known structure, for measuring the position of the wafer stage 107 with respect to the X-Y plane. Denoted at 110 is a console unit for controlling the projection exposure apparatus as a whole. Denoted at 111 is an alignment detecting unit of known structure, for detecting alignment marks formed on the wafer 1 through the projection lens 103 to determine the position of the wafer 1 with respect to the X-Y plane. The console unit 110 controls the projection exposure apparatus as a whole and, additionally, it performs determination and selection of shot layouts to be described later. The sequential steps to be described below are executed through a central processing unit (CPU) in this console unit 101, except stated otherwise.

Next, referring to FIG. 7, determination of chip layout to be executed through the CPU of the console unit 110, in accordance with an embodiment of the present invention, will be explained. This embodiment involves three steps, i.e., a first step, a second step and a third step.

Figure 3:
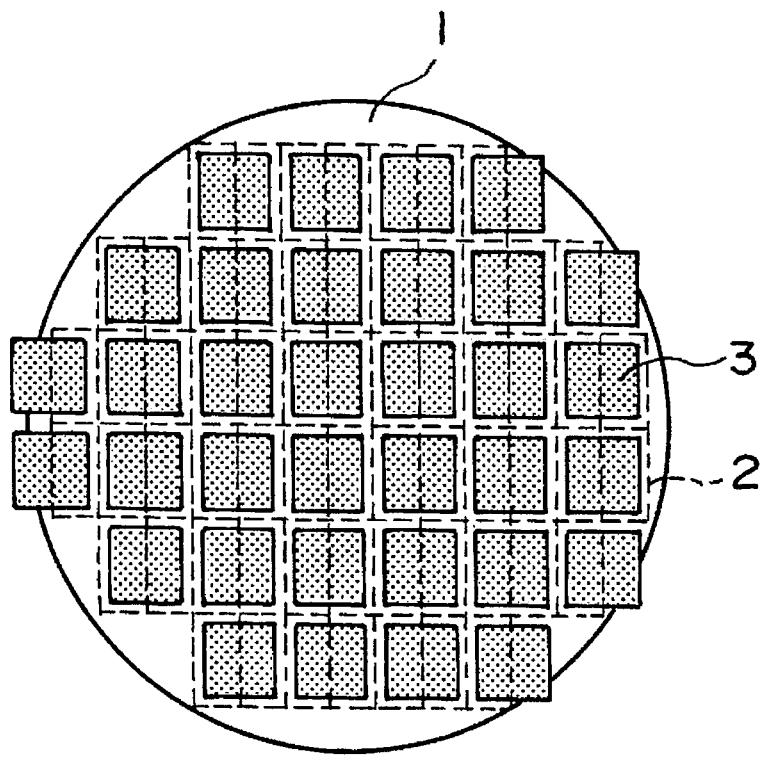
FIG. 3 is a schematic view for explaining an example of shot layout, selected to the chip layout of FIG. 2, wherein two chips are exposed through one shot.
Figure 4:
FIG. 4 is a schematic view for explaining an example of chip layout within a shot, to be used in the shot layout of FIG. 3.
Figure 6:
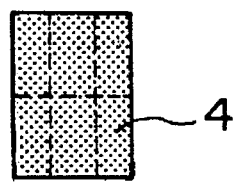
FIG. 6 is a schematic view for explaining an example of chip layout within a shot, to be used in the shot layout of FIG. 5.
Figure 7:
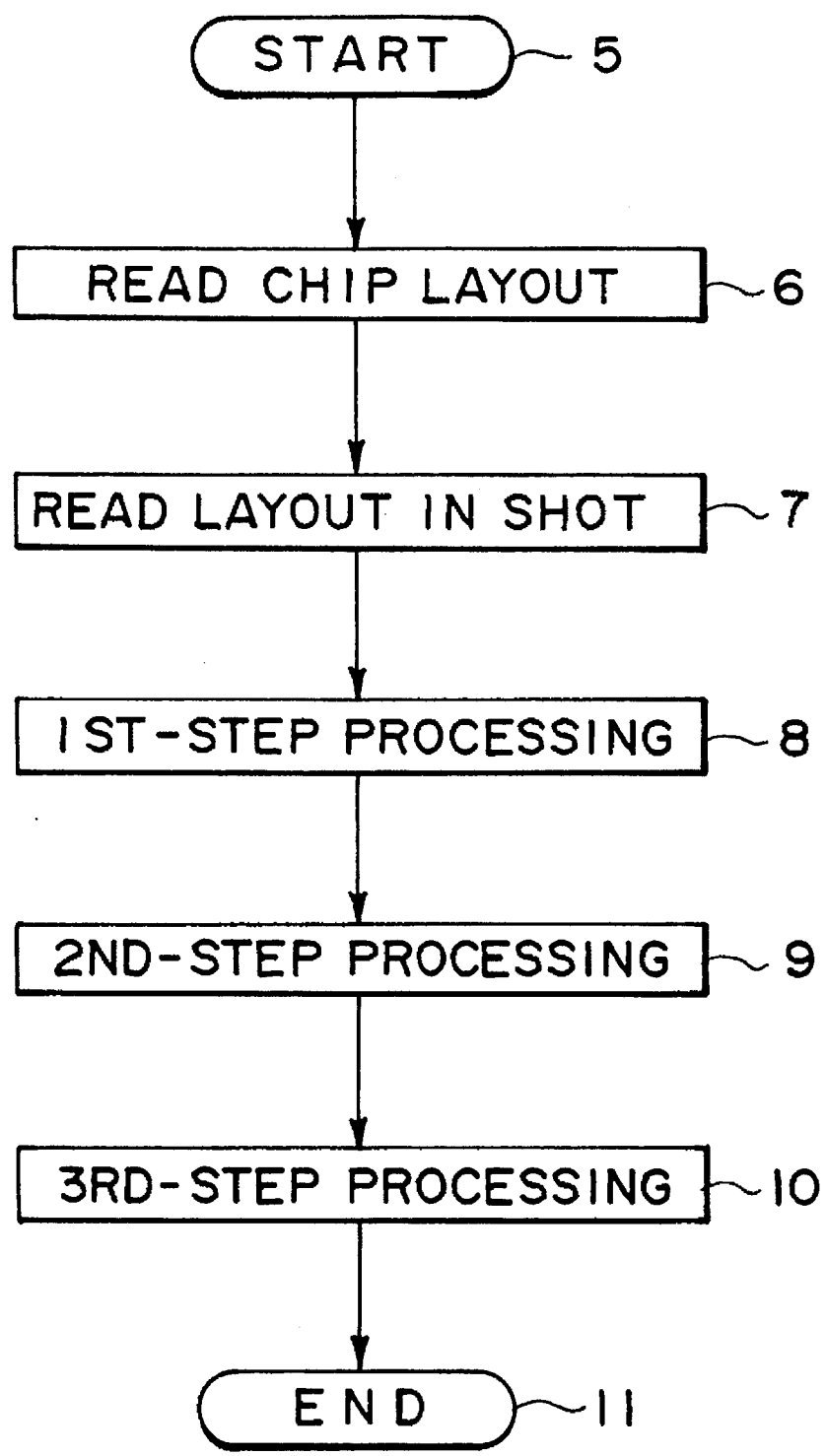
FIG. 7 is a flow chart for explaining an embodiment of the present invention.

In the flow chart of FIG. 7, in response to start of execution of the program for determination of a layout of least shot number (Step 5), the layout of chips as already formed on the wafer 1 (which is to be processed by step-and-repeat exposures through the projection exposure apparatus (stepper) such as shown in FIG. 25) is read out from an external data storing means, not shown (Step 6). This chip layout of the wafer 1 may be a layout which is directly determined by the size of each chip and which assures production of a largest number of chips, or it may be a layout as determined while taking into account a problem or problems related to a process or processes. In this embodiment, the chip layout such as shown in FIG. 2 is uses as an example. Subsequently, the chip layout (chip pattern on the reticle 101) within the range of the projection exposure field of the stepper, i.e., within the projection region of the projection lens system 103, to be used for exposure of the wafer 1, is read out (Step 7). This layout may be one including two or three chips per shot (see FIG. 4) if the stepper is a higher resolution stepper, or it may be one including six to ten chips per shot (see FIG. 6), if the stepper is a wider field and lower resolution stepper, though the number depends on the view angle of the projection lens 103. In this embodiment, the chip layout within the shot 4 as shown in FIG. 6 is used, as an example. After execution of the data reading at Step 6 and Step 7, the sequence goes to the process at the first step (Step 8).

The process of the first step (Step 8) will be explained in conjunction with FIGS. 8–14.

Figure 8:
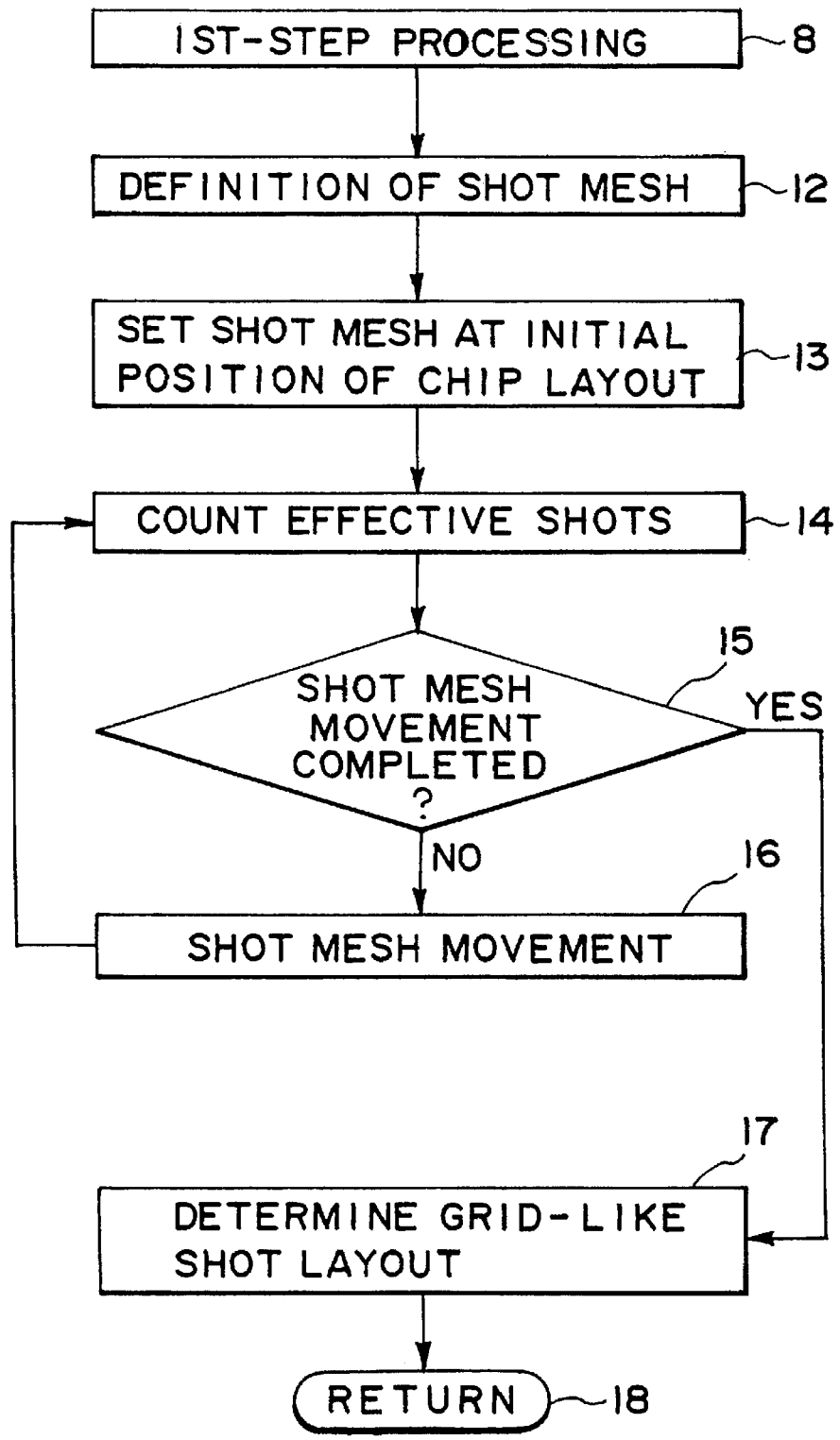
FIG. 8 is a flow chart for explaining details of the process of the first step, in this embodiment of the present invention.

The first step provides a process for determining a particular layout with which, to the chip layout on the wafer 1 as predetermined, the number of shots according to the grid-like shot placement becomes smallest. FIG. 8 is a flow chart of the process of the first step. FIGS. 9–14 show specific examples of the shot 4 layout. In FIG. 8, in response to start of the process of the first step, definition of shot mesh is first executed (Step 12). The shot mesh is to discriminate whether each shot 4 is placed at a position enabling exposure of chips of the wafer 1. Specifically, what is denoted at 19 in each of FIG. 9–14 is the shot mesh.

Figure 9:
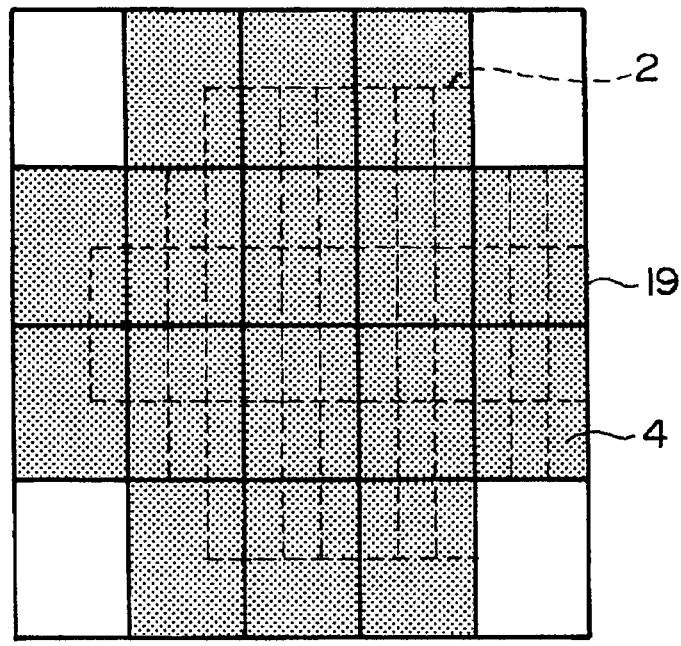
FIG. 9 is a schematic view for explaining details of the process of the first step.
Figure 10:
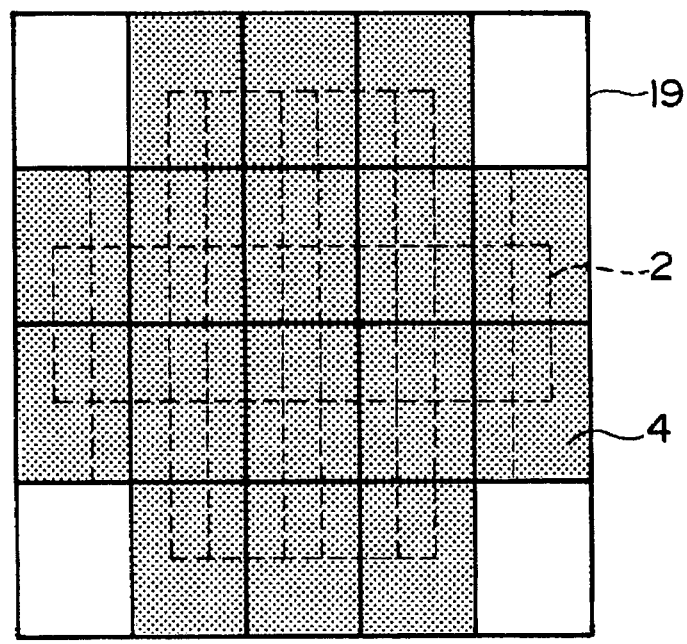
FIG. 10 is a schematic view for explaining details of the process of the first step.
Figure 11:
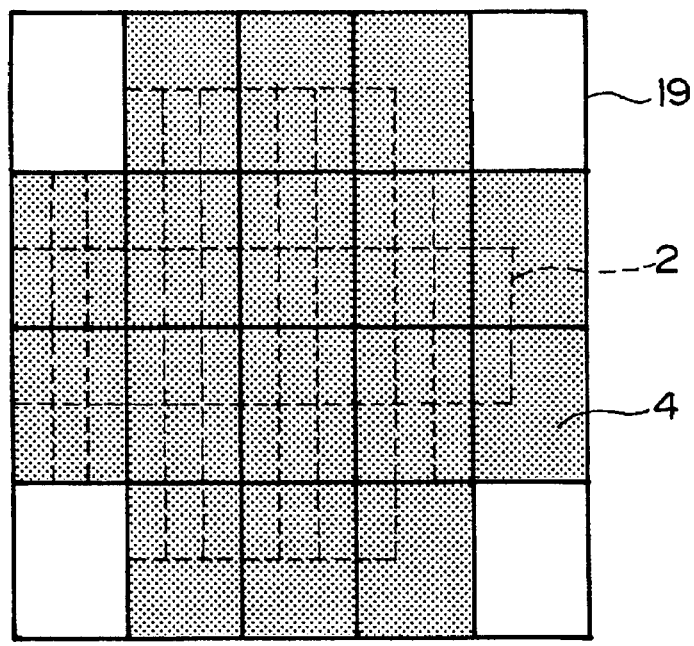
FIG. 11 is a schematic view for explaining details of the process of the first step.
Figure 12:
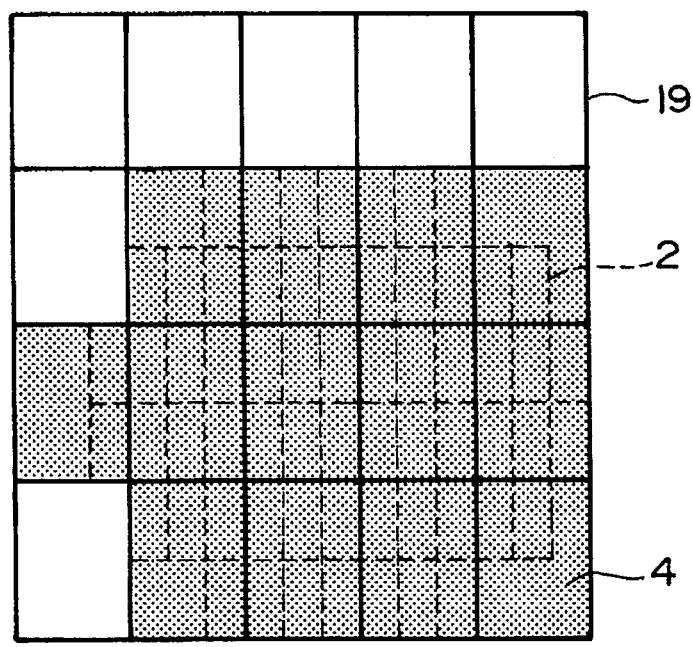
FIG. 12 is a schematic view for explaining details of the process of the first step.
Figure 13:
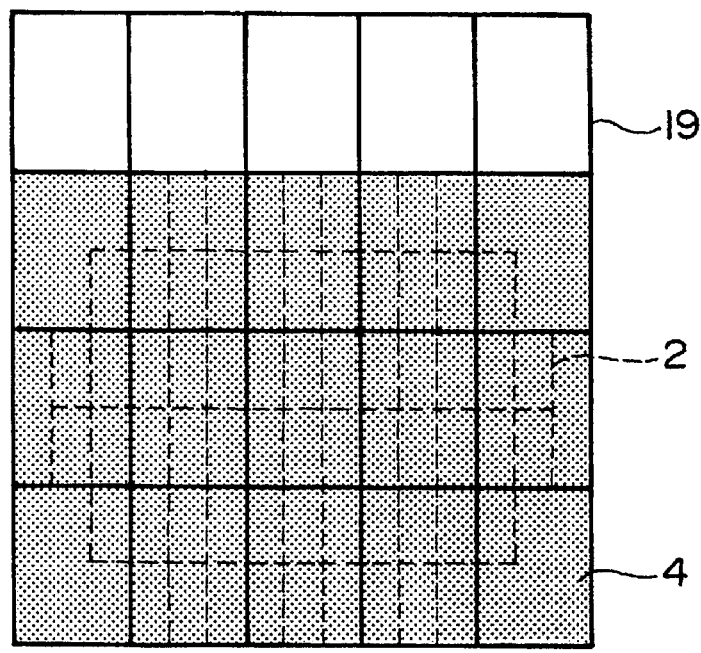
FIG. 13 is a schematic view for explaining details of the process of the first step.
Figure 14:
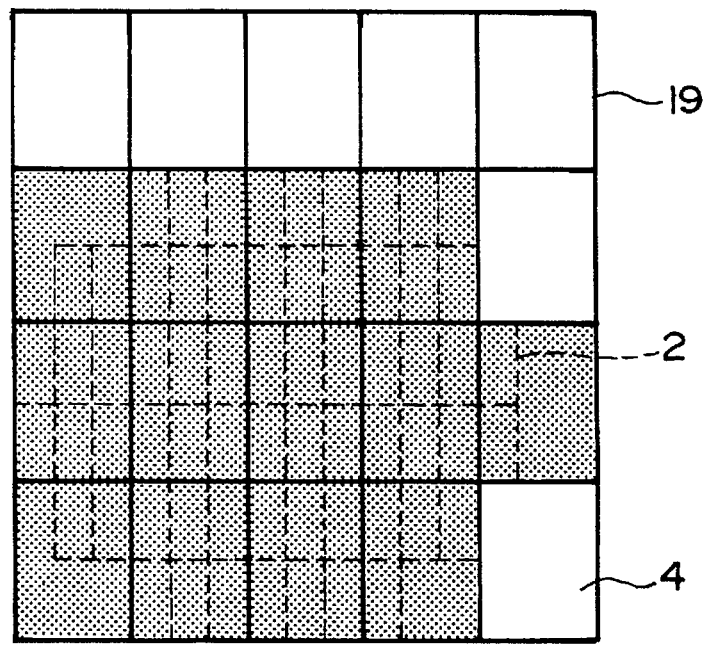
FIG. 14 is a schematic view for explaining details of the process of the first step.

The thus defined shot mesh 19 is then superposed at the initial position upon the chip layout 2 (Step 13). FIG. 9 illustrate this state. Then, those shots which are overlying on chips of the wafer 1, i.e., effective shots, are discriminated, and the number of these effective shots is counted (Step 14). In the example of FIG. 9, the number of effective shots (painted gray) is sixteen (16). As regards the superposition of the shot mesh 19, in this example there are six ways of superposition since the number of chips in one shot is six (see FIG. 6). Thus, after completion of counting the number of effective shots in the state as shown in FIG. 9, the shot mesh 19 is shifted translationally by one chip, as seen in FIG. 10, and the counting of effective shots is repeated. In the example of FIG. 10, the number of effective shots is sixteen (16).

After this, as seen from FIGS. 11–14, a loop of shifting the shot mesh 19 and counting effective shots is repeated by total six times (Step 14 to Step 16), and, with respect to each shot mesh 19 position, the number of effective shots is determined. Then, the thus determined effective shot numbers are compared with each other, and a particular grid-like layout which provides a least shot number is determined (Step 17). In this embodiment, the smallest effective shot number is realized in the cases of FIGS. 12–14. Thus, the process of the first step (Step 8 of FIG. 7) is completed. The sequence goes back to the main program of FIG. 7, and then goes to the process of the second step (Step 9 of FIG. 7).

Figure 15:
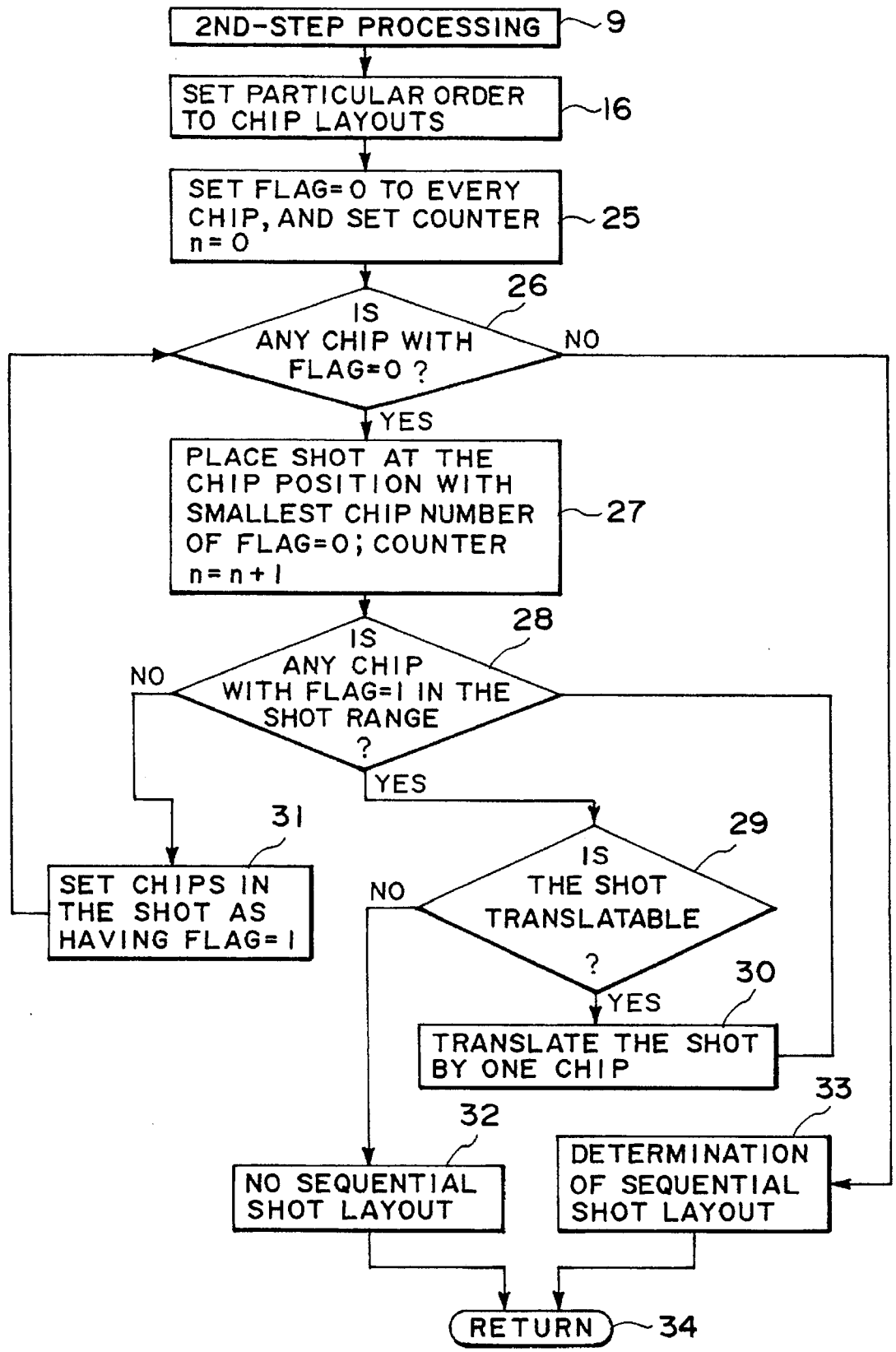
FIG. 15 is a flow chart for explaining details of the process of the second step in this embodiment.

The process of the second step (Step 9) will be explained in conjunction with FIGS. 15–18. The second step provides a process for determining sequential random placement, as described hereinbefore, in which, to the chip layout 2, shots 4 are sequentially placed in order from an end of the chips without overlapping of shots 4. FIG. 15 is a flow chart of the process of the second step, and FIGS. 15–18 shows an example explaining how shots are specifically placed in order from an end of the chips.

Figure 19:
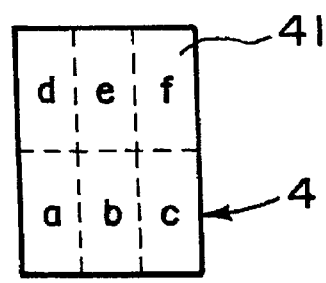
FIG. 19 is a schematic view for explaining details of the process of the second step.

In the flow chart of FIG. 15, in response to start of the process, ordinals or ordinal references are first assigned to the chips 2 on the wafer 1 and to the chips 41 within the range of the exposure field (shot 4) (Step 46). This is illustrated in FIGS. 15 and 19. As illustrated, ordinals or sequential numbers 1, 2, 3 . . . are assigned to the chips 2 of the wafer 2, in order from the left-hand end of the bottom row, while ordinal or sequential references a, b, c . . . are assigned to the chips 41 within the shot 4, in order from the left-hand and bottom end. It is to be noted here that the manner of assignment of ordinals or ordinal or sequential references Is not limited to the one described just above. Subsequently, a flag "flag=0" is set to every chip on the wafer 1, and a count "n=0" is set as the count "n" of the counter for counting the shot number (Step 25). This flag is to discriminate whether a chip is within the range of the shot 4, when the shot 4 is displaced in accordance with the algorithm of the shot placement. Here, "flag =0" means that the chip is not within the range of the shot while "flag=1" means that the chip is within the range of the shot.

Figure 16:
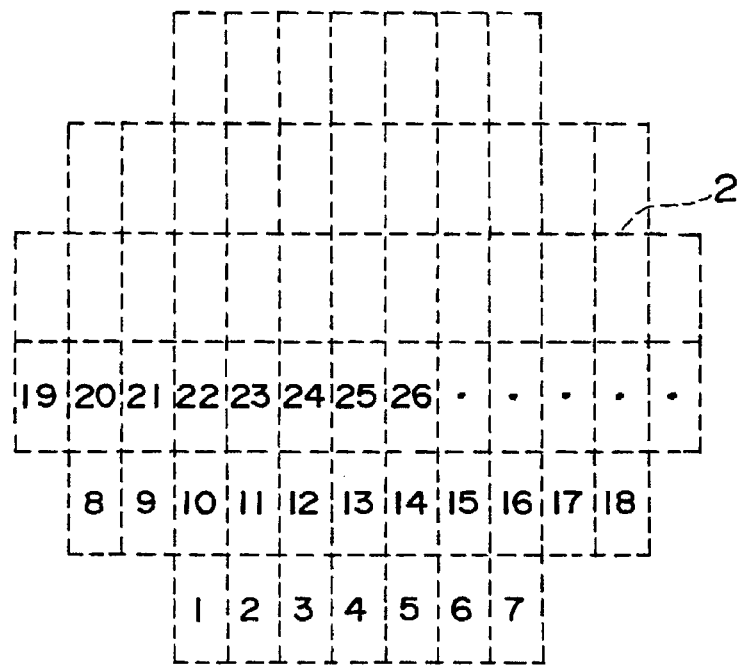
FIG. 16 is a schematic view for explaining details of the process of the second step.
Figure 17:
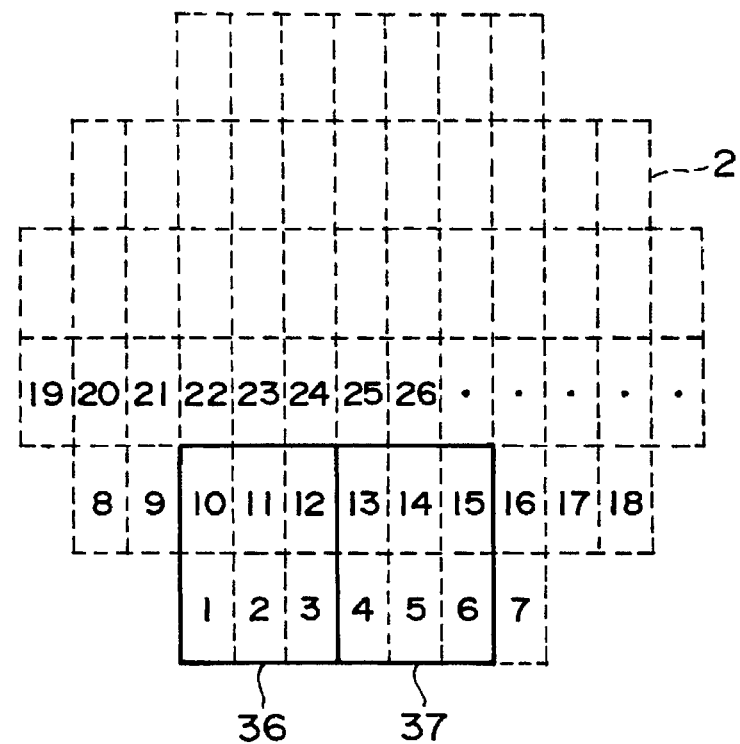
FIG. 17 is a schematic view for explaining details of the process of the second step.

At the initial stage, the shot 4 has not yet been placed and, therefore, "flag=0" is set to every chip on the wafer 1. Subsequently, whether there is a chip or chips of "flag=0"0 is discriminated (Step 26). Since at the initial stage all the chips have "flag=0", the sequence goes to the procedure at Step 27. At Step 27, the count "n" of the shot number counter is incremented by one, and a chip "a" of the shot 4 (see FIG. 19) is superposed upon one chip of the wafer 1 as having "flag=0" and having a least or earliest chip number or chip reference (here, the first chip with a number 1 in FIG. 16). Hereinafter, a chip with an ordinal or reference "n" will be referred to as "n-th chip". Shot 17 in FIG. 17 shows this superposition. Subsequently, discrimination is made as to whether there is a chip or chips with a flag "flag=1", that is, a chip or chips already superposed by the shot 4 (Step 28). Since at the initial stage all the chips with numbers 1, 1, 3, 10 and 12 have a flag "flag=0", the sequence goes to the procedure at Step 31, where a flag "flag=1" is set to all the chips within the shot 36. The placement of the first shot is thus completed, and the procedure at Step 26 is executed again.

There remain chips with a flag "flag=0" on the wafer 1, and the placement of a second shot starts at Step 27 in a similar manner. In this case, the chip having a smallest or earliest chip number and having a flag "flag=0" is the chip 4, the chip "a" within the shot 4 is superposed upon this chip 4 of the wafer 1, and the count "n" of the shot number counter is incremented by one. Shot 37 in FIG. 17 shows this superposition. Since in this state there is no chip with a flag "flag=1" within the range of the shot 37 (Step 28), a flag "flag=1" is set to all the chips with numbers 4, 5, 6, 13, 14 and 15 within the shot 37 (Step 31). The placement of the second shot is then completed. The sequential random shot placement basically comprises the above-described procedure with respect to each shot.

Figure 18:
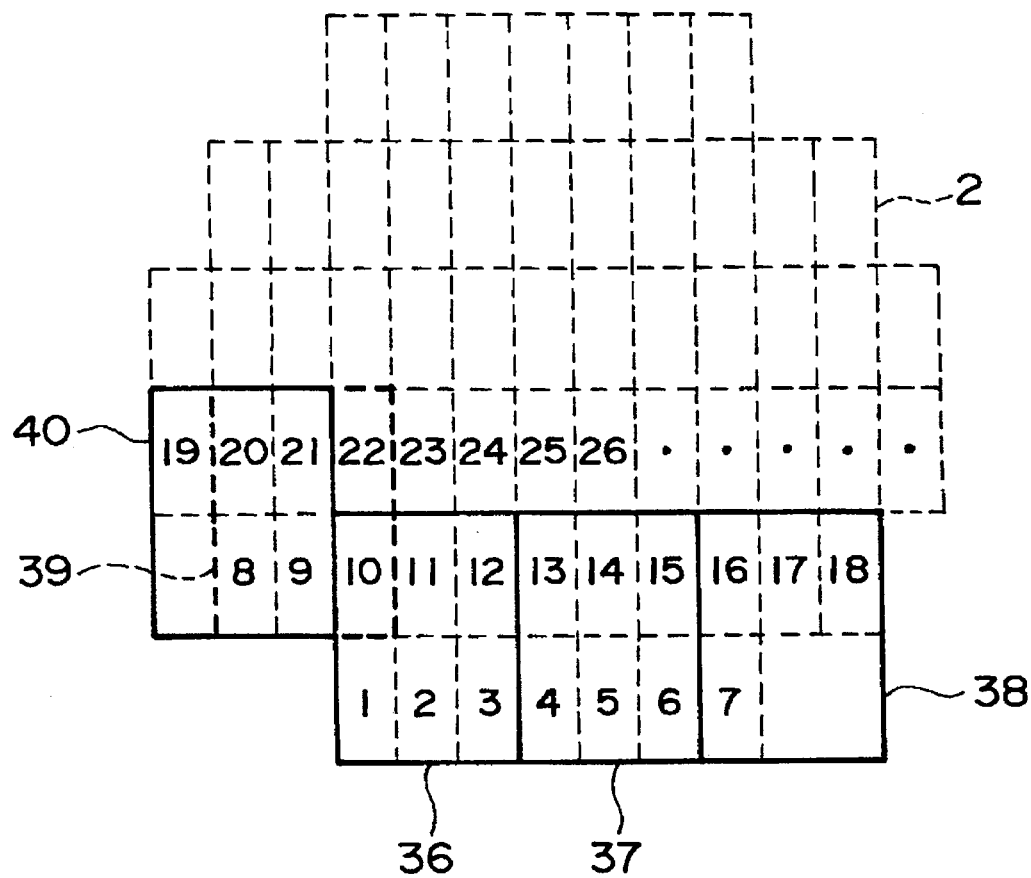
FIG. 18 is a schematic view for explaining details of the process of the second step.

However, if the chip "a" of the shot 4 is placed at the position of a ship with a flag "flag=0" and with a smallest chip number, it causes overlap of that shot with a shot already placed. Thus, if there is a chip or chips with a flag "flag=1" within that shot, the succeeding procedure should take another loop. FIG. 18 shows this. As shots 4 are placed sequentially in accordance with the above-described algorithm, at the fourth shot, a shot 4 is once placed at the position depicted by a broken line (dot line) 39 in FIG. 18. However, a chip of a number 10 within that shot already has a flag "flag=1", and a different procedure should be taken. Thus, in this case, the sequence shifts from Step 28 to Step 29. If this shot can be shifted translationally (Step 29), the shot 4 is shifted translationally along the wafer 1 surface by a distance corresponding to one chip (Step 30). The shot as denoted at 40 in FIG. 18 is the thus translationally shifted shot. In this manner, overlapping shot placement is avoided. Namely, all the chips within the shot 4 have a flag "flag=0" (Step 28), and the sequence returns to the normal loop. Then, a flag "flag=1" is set to the chips in the shot, and placement of the fourth shot is fixed.

There is however a possibility that the overlap of shots can not be avoided with any translational shift of the shot 4. In that occasion, it is concluded that there is no possible sequential random placement (Step 32), and the loop is finished. In the case of FIG. 16, there is no such possibility. Thus, placement of shots is sequentially fixed with repetition of the above-described procedure, and finally a shot layout such as shown in FIG. 1 is provided. The number of shots in the sequential random shot placement is twelve (12). Thus, the procedure of the second step (Step 9 of FIG. 7) is completed, and the sequence goes back to the main program of FIG. 7.

Figure 5:
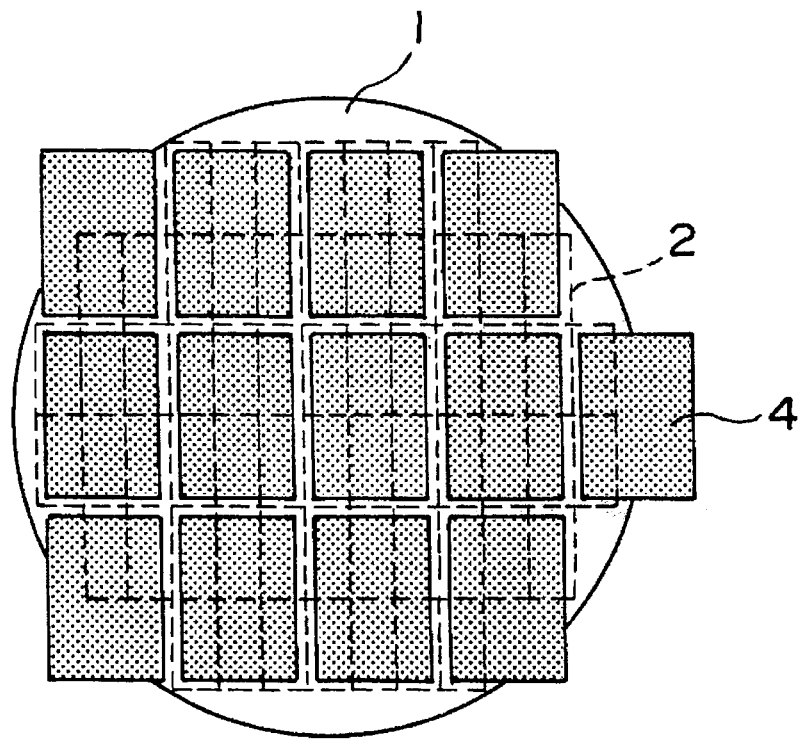
FIG. 5 is a schematic view for explaining an example of grid-like shot placement, to the chip layout of FIG. 2, wherein six chips are exposed through one shot.

Finally, the procedure of the third step (Step 9) will be explained. The procedure of the third step is shown in the flow chart of FIG. 20. As the procedure of the third step (Step 9) starts, at Step 42 the layout (see FIG. 5) as determined by the first step (Step 8 of FIG. 7) and the layout (see FIG. 1) as determined by the second step (Step 9 of FIG. 7) are compared with each other (Step 42). In this embodiment, the number of shots determined by the first step is thirteen (13) while the number of shots determined by the second step is twelve (12). Thus, a layout that provides a least shot number is the one as illustrated in FIG. 1 (Step 43). As a matter of course, if there is no sequential random shot placement, the layout that provides a least shot number is the layout as determined by the first step. The procedure of the third step is thus finished, and the sequence goes back to the main program of FIG. 7. All the procedures are thus completed.

In the embodiment described above, the invention is applied to the shot placement for a wider field stepper of six chips per shot. However, as a matter of course, the invention is applicable also to the shot placement for a higher resolution stepper. It will be readily understood that, in the shot placement for such higher resolution stepper, the present invention effectively assures significant enhancement of productivity through reduction in shot number.

The described above is a first embodiment of the present invention. Now, a second embodiment of the present invention will be explained. This embodiment has a specific feature in the assignment of ordinal references to the chips of the wafer 1 and within the exposure field (shot 4), in the flow chart of FIG. 15 which shows the second step (Step 9 of FIG. 7) of the first embodiment.

Like the first embodiment, as the program for determining a layout of a least shot number starts in the flow chart of FIG. 7, a predetermined chip layout is read out (Step 6). Subsequently, the chip layout within the range of exposure field (shot 4) of a stepper (see FIG. 25) to be used for exposure of a wafer 1, is read out (Step 7). Then, the procedure of the first step starts, and a layout of least shot number according to the grid-like shot placement is determined in a similar manner as in the preceding embodiment (Step 8). Then, the procedure of the second step (Step 8) starts. Here, in this embodiment, in the assignment of ordinals or ordinal references to the chips of the wafer 1 within the range of the exposure field (shot 4) at Step 46, ordinals are assigned in the manner such as illustrated in FIGS. 21–24. More specifically, the ordinal assignment is done in the order longitudinally from a chip at the leftmost end, as illustrated.

This results in that, since in accordance with the algorithm of the second step the first shot is so placed that the chip "a" within the exposure field (shot 4) is superposed upon the first chip of the wafer 1 with a number 1, the first shot is placed at the position denoted at 51 in FIG. 22. For the subsequent second shot, the chip "a" within the exposure field (shot 4) is once placed at the position of the chip of the wafer 1 with a number 3. However, at there, the shot overlaps with the first shot. Thus, the shot 4 is shifted translationally and upwardly by a distance corresponding to one chip, to thereby avoid the overlap. Thus, the second shot is placed at the position denoted at 53. Similarly, the third shot is placed at the position denoted at 54.

Figures 23, 24:
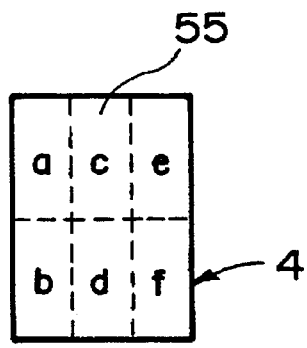
FIG. 23 is a schematic view for explaining a yet further embodiment of the present invention.
FIG. 24 is a schematic view for explaining a still further embodiment of the present invention.

As the placement of shot is executed sequentially in accordance with the algorithm of the second step, finally a shot layout such as shown in FIG. 23 is provided. In this layout, the number of shots is thirteen (13) which is greater than the number of twelve (12) in the case of the sequential random placement having been described with reference to the first embodiment. Thus, this is not the layout of smallest shot number. However, since there is a wide variety of patterns expected in regard to the chip array of a wafer 1 and the chip array within the exposure field (shot 4), it is possible that the ordinal assignment in the longitudinal direction such as above provides a smaller shot number. Also, any ordinal assignment other than this may be adopted within the scope of the present invention.

Next, a third embodiment of the present invention will be explained. This embodiment has a specific feature that the assignment of ordinals to the chips of the wafer and the chips within the exposure field (shot 4) at Step 46 in FIG. 15 is changed, and the procedure of the second step (Step 8 of FIG. 7) is execute twice. More specifically, in the first time execution of the procedure of the second step, the shots are placed with ordinals being assigned to the chips along a lateral direction, as in the first embodiment. In the second time execution of the procedure of the second step, on the other hand, the shots are placed while ordinals being assigned along a longitudinal direction, as in the second embodiment. The results of the twice shot placements are compared with each other, and one of them with a smaller shot number is selected and determined as the sequential random shot placement.

This assures a greater capability of determining the layout of smallest shot number, free from the dependency upon the variation of patterns of the chip layout of the wafer and of the chip layout within the exposure field. It is to be noted here that, as will be easily understood, the increase in times of ordinal assignment by two to the chips of the wafer and the chips within the exposure field, raises no problem. In that occasion, the probability of determination of the layout of smallest shot number becomes higher.

In this embodiment, like the first embodiment, the algorithm of the present invention is applied to the shot placement for a wider field stepper. However, as a matter of course, the concept of the present embodiment is applicable to the shot placement for a higher resolution stepper. It will be readily understood that, in the shot placement for such higher resolution stepper, the present invention effectively assures significant enhancement of productivity through reduction in shot number.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for projecting a pattern of an original onto different regions on a substrate sequentially, said apparatus comprising:

shot layout determining means serviceable to determine, on the basis of information related to a chip layout upon the substrate and of at least a chip layout within a projection exposure field and a chip layout within the pattern of the original, a first shot layout with which the number of shots is minimum when the shot layout takes a grid-like form and a second shot layout with which shots are placed in sequence, from an end of the chip layout upon the substrate, without overlap of shots, said shot layout determining means further being serviceable to compare the first and second shot layouts with each other and to select one of them which defines a smaller number of shots; and projection exposure means for performing a projection exposure operation in accordance with the shot layout as selected by said shot layout determining means.

2. An apparatus according to claim 1, wherein said shot layout determining means includes means for determining the first shot layout by superposing, upon the chip layout on the substrate, a grid-like array of rectangular areas each corresponding to the projection exposure field, and by counting the number of effective shots while moving the array, to determine a layout of a least shot number.

3. An apparatus according to claim 1, wherein said shot layout determining means includes means for determining the second shot layout by assigning ordinal references to chips of the chip layout on the substrate and to chips of the chip layout within the range of the projection exposure field and by repeatedly placing shots while superposing a chip of an earliest reference in the chip layout of the substrate and a chip of an earliest reference in the chip layout within the projection exposure field, without overlap of shots.

4. An apparatus according to claim 3, wherein said shot layout determining means selects the first shot layout when the second shot layout is not defined.

5. A semiconductor device manufacturing method for performing a semiconductor device manufacturing process, including projecting a pattern of an original onto different regions on a substrate sequentially, said method comprising:

a first step for determining, on the basis of information related to a chip layout upon the substrate and of at least a chip layout within a projection exposure field and a chip layout within the pattern of the original, a first shot layout with which the number of shots is minimum when the shot layout takes a grid-like form;

a second step for determining, on the basis of the information, a second shot layout with which shots are placed in sequence, from an end of the chip layout upon the substrate, without overlap of shots; and a third step for comparing the first and second shot layouts with each other and selecting one of them which defines a smaller number of shots, as a shot layout for the projection exposure operation.

6. A method according to claim 5, wherein the first shot layout is determined by superposing, upon the chip layout on the substrate, a grid-like array of rectangular areas each corresponding to the projection exposure field, and by counting the number of effective shots while moving the array to determine a layout of a least shot number.

7. A method according to claim 5, wherein the second shot layout is determined by assigning ordinal references to chips of the chip layout on the substrate and to chips of the chip layout within the range of the projection exposure field and by repeatedly placing shots while superposing a chip of an earliest reference in the chip layout of the substrate and a chip of an earliest reference in the chip layout within the projection exposure field, without overlap of shots.

* * * * *

UNITED STATES PATENT AND TRADEMARK OFFICE
CERTIFICATE OF CORRECTION

PATENT NO. : 5,654,792
DATED : August 5, 1997
INVENTOR(S) : MASAMI YONEKAWA

It is certified that error appears in the above-identified patent and that said Letters Patent is hereby corrected as shown below:

ON THE COVER PAGE:

Under The Title, item [54]

Line 3, "OPTIMIALLY" should read --OPTIMALLY--.

Under The "ABSTRACT", item [57]

Line 1, "Disclosed is a" should read --A--.

COLUMN 1:

Line 3, "OPTIMIALLY" should read --OPTIMALLY--;
    Line 9, "in" should read --in the--;
    Line 13, "Increasing" should read --An increasing-- and "a" should be deleted;
    Line 14, "device" should read --devices-- and "IC or LSI" should read --ICs or LSIs--;
    Line 17, "as regards" should be deleted and "it" should be deleted;
    Line 20, "aiming at" should read --aimed towards--;
    Line 35, "is" should read --is a--;
    Line 50, "shot" should read --shots--;
    Line 55, "is" should read --is a--; and
    Line 60, "wafers" should read --wafers and--.

UNITED STATES PATENT AND TRADEMARK OFFICE
CERTIFICATE OF CORRECTION

PATENT NO.   : 5,654,792
DATED        : August 5, 1997
INVENTOR(S)  : MASAMI YONEKAWA It is certified that error appears in the above-identified patent and that said Letters Patent is hereby corrected as shown below:

COLUMN 2:

Line 3, "to" should read --to a--.

COLUMN 3:

Line 66, "It" should read --it--.

COLUMN 4:

Line 13, "of" should read --of a--;
    Line 15, "of" should read --of a--;
    Line 17, "of" should read --of a--;
    Line 21, "of" should read --of a--;
    Line 24, "of" should read --of a--; and
    Line 27, "of" should read --of a--.

COLUMN 5:

Line 4, "for" should read --for the--;
    Line 12, "of" should read --of a--;
    Line 26, "of" should read --of a--;
    Line 32, "of" should read --of a--;
    Line 34, "of" should read --of an--;
    Line 45, "of" should read --of a--;
    Line 50, "of" should read --of a--;
    Line 58, "except" should read --except as--; and
    Line 65, "to" should read --to a--.

UNITED STATES PATENT AND TRADEMARK OFFICE
CERTIFICATE OF CORRECTION

PATENT NO. :  5,654,792           Page 3 of 5
DATED      :  August 5, 1997
INVENTOR(S):  MASAMI YONEKAWA It is certified that error appears in the above-identified patent and that said Letters Patent is hereby corrected as shown below:

COLUMN 6:

Line 10, "uses" should read --used--;
   Line 33, "to" should read --to a--;
   Line 34, "is" (second occurrence) should read --is used--;
   Line 37, "FIG. 9-14" should read --FIGS. 9-14--;
   Line 40, "illustrate" should read --illustrates--;
   Line 45, "example" should read --example,--;
   Line 54, "by" should read --by a--; and
   Line 55, "total" should read --total of--.

COLUMN 7:

Line 5, "shows" should read --show--;
   Line 7, "to" should read --to a--;
   Line 13, "2," should read --1,--;
   Line 18, "Is" should read --is--;
   Line 29, ""flag=0"0" should read --"flag=0"--;
   Line 31, "have" should read --have a--;
   Line 34, "having" should read --having a--;
   Line 38, "as" should read --as the--; and
   Line 65, "causes" should read --causes an--.

UNITED STATES PATENT AND TRADEMARK OFFICE
CERTIFICATE OF CORRECTION

PATENT NO.   : 5,654,792   Page 4 of 5
DATED        : August 5, 1997
INVENTOR(S)  : MASAMI YONEKAWA It is certified that error appears in the above-identified patent and that said Letters Patent is hereby corrected as shown below:

COLUMN 8:

Line 17, "is however" should read --is, however,--;
    Line 18, "can not" should read --cannot--;
    Line 19, "In" should read --On--;
    Line 23, "finally" should read --finally,--;
    Line 52, "such" should read --such a--;
    Line 55, "The" should read --The embodiment--; and
    Line 65, "of" should read --of the--.

COLUMN 9:

Line 1, "of" (second) should read --of a --;
    Line 19, "at there," should read --at this position,--;
    Line 25, "of" should read --of the--;
    Line 31, "of" should read --of the--;
    Line 34, "in" should read --with--;
    Line 36, "as" should read --as described--;
    Line 46, "execute" should read --executed--;
    Line 51, "being" should read --are--;
    Line 55, "as" should read --to be--; and
    Line 64, "In" should read --On--.

UNITED STATES PATENT AND TRADEMARK OFFICE
CERTIFICATE OF CORRECTION

PATENT NO.   :   5,654,792            Page 5 of 5
DATED        :   August 5, 1997
INVENTOR(S)  :   MASAMI YONEKAWA It is certified that error appears in the above-identified patent and that said Letters Patent is hereby corrected as shown below:

COLUMN 10:

Line 6, "such" should read --such a--.

Signed and Sealed this

Tenth Day of March, 1998

Attest:

BRUCE LEHMAN

Attesting Officer

Commissioner of Patents and Trademarks